(12) United States Patent
Crafts et al.

(10) Patent No.: US 9,184,314 B2
(45) Date of Patent: Nov. 10, 2015

(54) SHIELDED ELECTRICAL CONTACT AND DOPING THROUGH A PASSIVATING DIELECTRIC LAYER IN A HIGH-EFFICIENCY CRYSTALLINE SOLAR CELL, INCLUDING STRUCTURE AND METHODS OF MANUFACTURE

(75) Inventors: Douglas Crafts, Los Gatos, CA (US); Oliver Schultz-Wittman, Sunnyvale, CA (US)

(73) Assignee: TETRASUN, INC., Saratoga, CA (US)

( * ) Notice: Subject to any disclaimer, the term of this patent is extended or adjusted under 35 U.S.C. 154(b) by 330 days.

(21) Appl. No.: 13/637,176

(22) PCT Filed: Mar. 25, 2011

(86) PCT No.: PCT/US2011/029911
§ 371 (c)(1),
(2), (4) Date: Sep. 25, 2012

(87) PCT Pub. No.: WO2011/119910
PCT Pub. Date: Sep. 29, 2011

(65) Prior Publication Data
US 2013/0042913 A1 Feb. 21, 2013

Related U.S. Application Data

(60) Provisional application No. 61/318,099, filed on Mar. 26, 2010.

(51) Int. Cl.
*H01L 31/18* (2006.01)
*H01L 31/0216* (2014.01)
*H01L 31/0224* (2006.01)
*H01L 31/0236* (2006.01)
*H01L 31/0352* (2006.01)

(52) U.S. Cl.
CPC .... *H01L 31/02167* (2013.01); *H01L 31/02363* (2013.01); *H01L 31/022425* (2013.01); *H01L 31/03529* (2013.01); *H01L 31/1804* (2013.01); *Y02E 10/52* (2013.01); *Y02E 10/547* (2013.01)

(58) Field of Classification Search
CPC .................................................. H01L 27/14627
USPC ...................... 438/69; 136/256; 257/E31.128
See application file for complete search history.

(56) References Cited

U.S. PATENT DOCUMENTS

2010/0025683 A1* 2/2010 Cheng ............................. 257/49
2010/0186808 A1* 7/2010 Borden ......................... 136/256

FOREIGN PATENT DOCUMENTS

| JP | Hei 4-302480 A | 10/1992 |
| JP | 09199738 A | 7/1997 |
| JP | 2001-093849 A | 4/2001 |
| JP | 2007-194636 A | 8/2007 |
| JP | 2009206469 A | 9/2009 |
| KR | 100790956 B1 | 1/2008 |

* cited by examiner

OTHER PUBLICATIONS

Machine translation of KR 10-0790956; published Jan. 3, 2008; printed Sep. 10, 2014.*
International Search Report for PCT/US2011/029911 dated Nov. 28, 2011.

*Primary Examiner* — Edward Wojciechowicz
(74) *Attorney, Agent, or Firm* — Kevin P. Radigan, Esq.; Heslin Rothenberg Farley & Mesiti P.C.

(57) ABSTRACT

Solar cell structures and formation methods which utilize the surface texture in conjunction with a passivating dielectric layer to provide a practical and controllable technique of forming an electrical contact between a conducting layer and underlying substrate through the passivating dielectric layer, achieving both good surface passivation and electrical contact with low recombination losses, as required for high efficiency solar cells. The passivating dielectric layer is intentionally modified to allow direct contact, or tunnel barrier contact, with the substrate. Additional P-N junctions, and dopant gradients, are disclosed to further limit losses and increase efficiency.

9 Claims, 13 Drawing Sheets

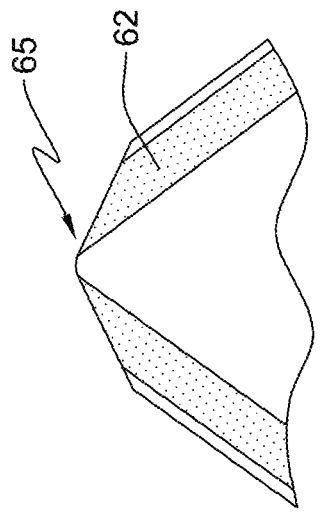
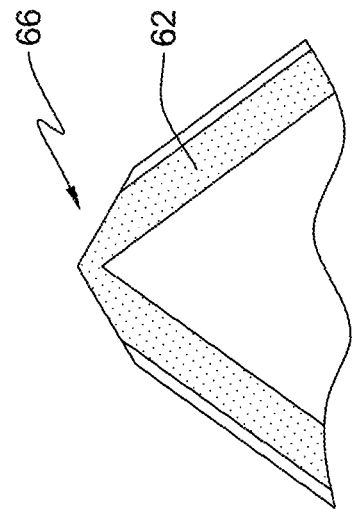
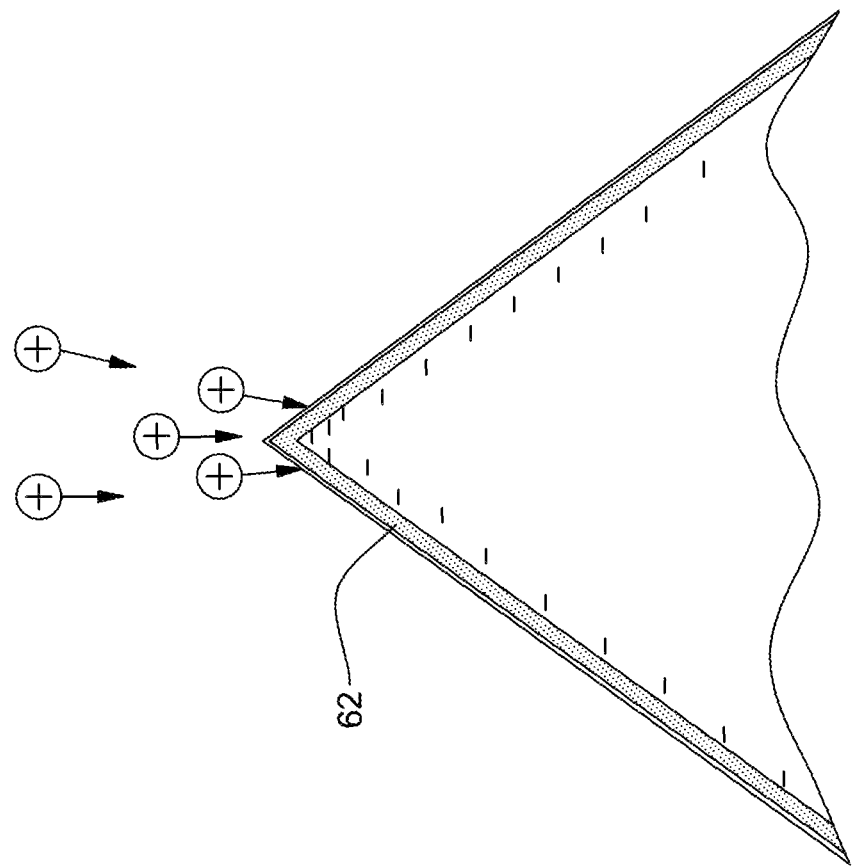

RF BIAS

RF BIAS

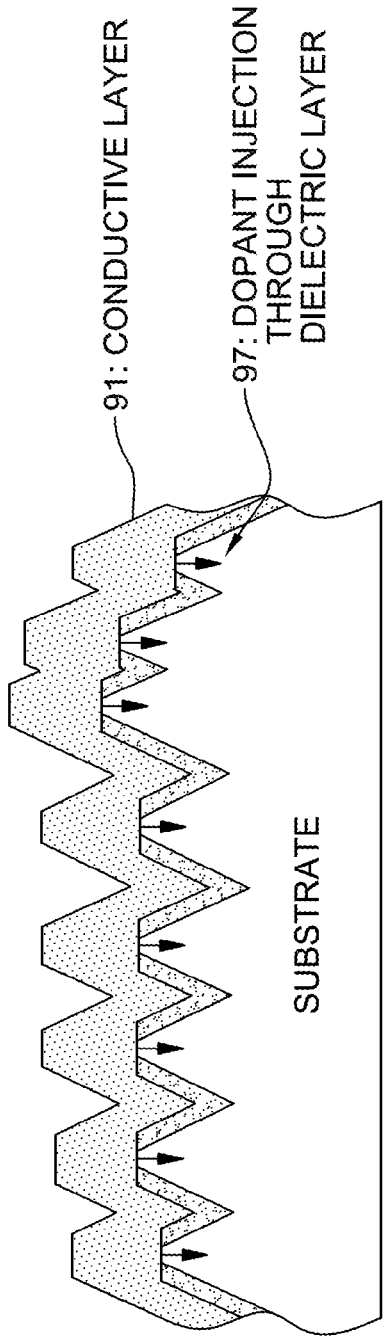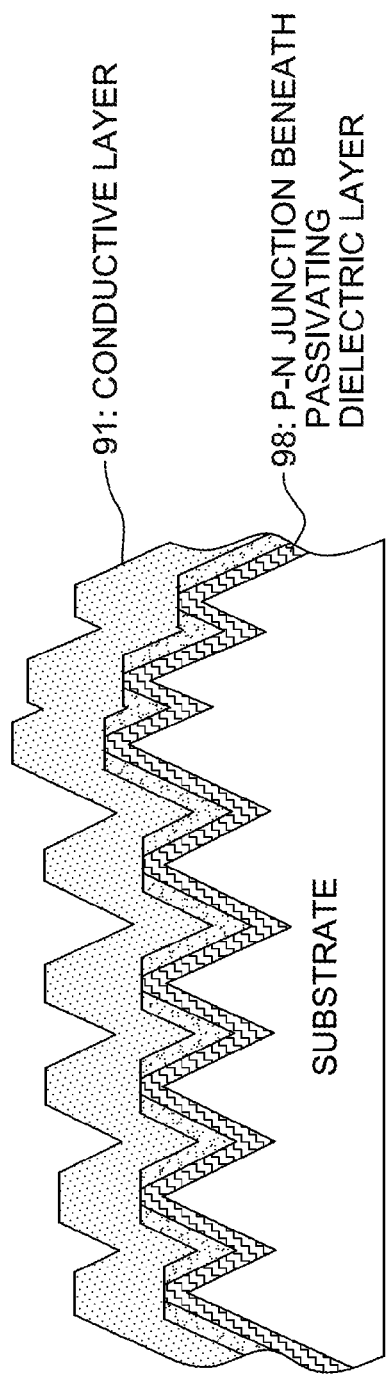

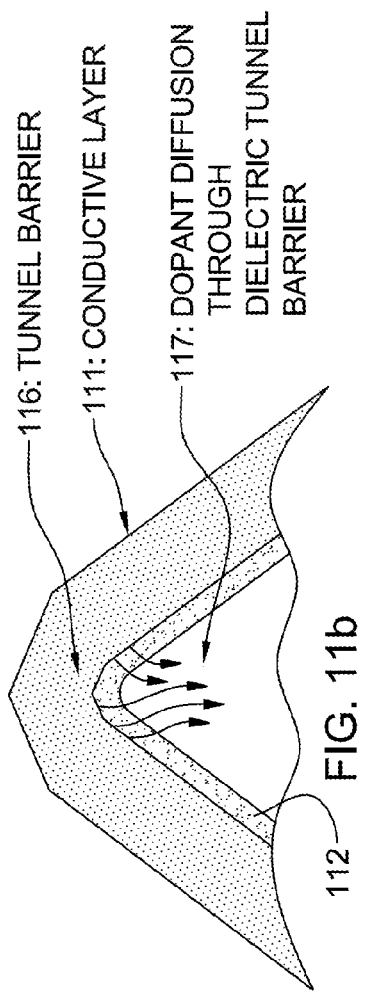
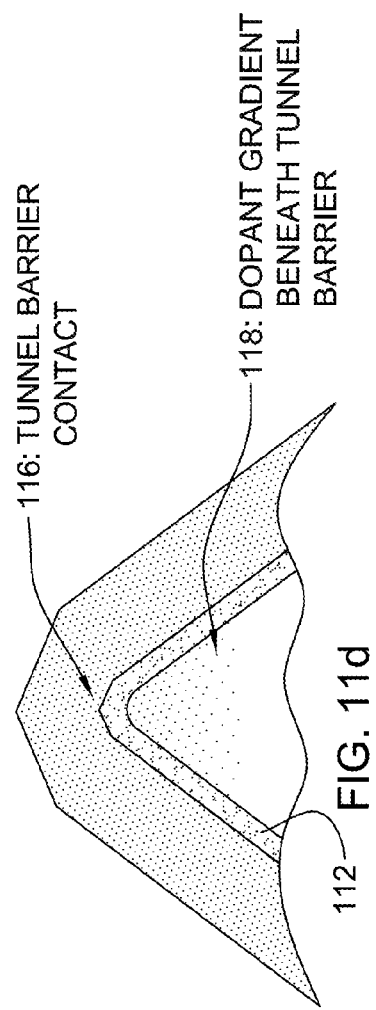
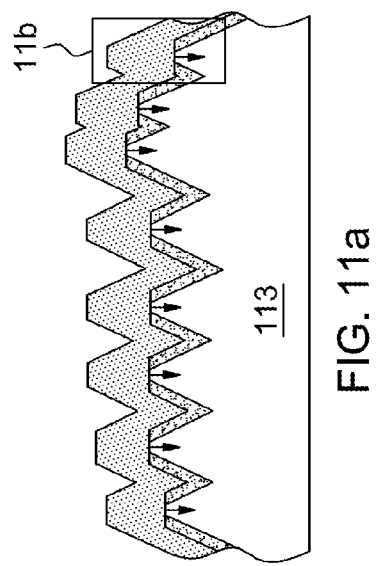
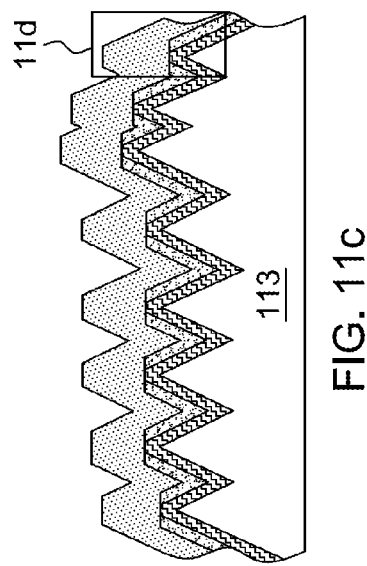

SHIELDED ELECTRICAL CONTACT AND DOPING THROUGH A PASSIVATING DIELECTRIC LAYER IN A HIGH-EFFICIENCY CRYSTALLINE SOLAR CELL, INCLUDING STRUCTURE AND METHODS OF MANUFACTURE

RELATED APPLICATION INFORMATION

This Application is a National Stage filing under Section 371 of International Application No. PCT/US2011/029911, which claims priority from U.S. Provisional Patent Application Ser. No. 61/318,099, filed Mar. 26, 2010. This Application and International Application No. PCT/US2011/029911 are also related to PCT Application Serial No. PCT/US2010/031869, filed Apr. 21, 2010, which was published on Oct. 28, 2010, as International Publication No. WO 2010/123974 A1, and which claims priority from U.S. Provisional Application Ser. No. 61/171,194, filed Apr. 21, 2009, and entitled "High-Efficiency Solar Cell Structures and Methods of Manufacture", the entirety of each of which is hereby incorporated herein by reference. All aspects of the present invention may be used in combination with the disclosures of the above-noted Applications.

TECHNICAL FIELD

The present invention relates to solar cells. More particularly, the present invention relates to improved solar cell structures and methods of manufacture for increased cell efficiency.

BACKGROUND OF THE INVENTION

Solar cells are providing widespread benefits to society by converting essentially unlimited amounts of solar energy into useable electrical power. As their use increases, certain economic factors become important, such as high-volume manufacturing and efficiency.

With reference to the schematic views of exemplary solar cells of, e.g., FIGS. 1-2 below, solar radiation is assumed to preferentially illuminate one surface of a solar cell, usually referred to as the front side. In order to achieve a high energy conversion efficiency of incident photons into electric energy, an efficient absorption of photons within a silicon wafer is important. This can be achieved by a low parasitic optical absorption of photons within all layers except the wafer itself. Surface texturization is a well known technique for improved capture of the incident light radiation. Texturization may be effected in several ways, but most commonly formed using a wet acid or alkaline etch, in which the surface of the wafer etches non-uniformly, leaving a dense field of pyramids or conical-spikes over the entire surface of the solar cell substrate. However, it is understood that the geometrical shape and/or surfaces may be textured in any shape beneficial for improved solar cell efficiency.

An important parameter for high solar cell efficiency is surface passivation. Surface passivation is generally considered to effect the suppression of recombination of electrons and holes at or in the vicinity of certain physical surfaces of the wafer. Surface recombination can be reduced by the application of dielectric layers over the substrate. These layers reduce the interface density of states and therefore reduce the number of recombination centers. The most prominent examples are thermally grown silicon oxide and PECVD deposited silicon nitride. Other examples of surface passivating layers include intrinsic amorphous silicon, aluminum nitride, aluminum oxide, etc. This principle is illustrated in FIG. 1. The aforementioned layers can also provide an electrical charge which introduces a repelling force, which reduces the availability of carriers of the opposite polarity to recombine, thereby reducing recombination rates. The most prominent examples of charge carrying passivating layers are silicon nitride and aluminum oxide. Another method of reducing the amount of carriers of one type close to the surface is the diffusion of doping atoms either of the same or the opposite doping of the wafer doping type. In this case doping levels in excess of the wafer doping are necessary to obtain a high-low junction (also commonly called back surface field or front surface field) or a p-n junction. This can be combined with other methods of surface passivation mentioned above.

High efficiency solar cells require good surface passivation combined with a technique to make electrical contact to the substrate with minimal recombination losses. Exemplary solar cell structures and practical methods of forming the same, addressing the issues above, are the subject of this invention.

SUMMARY OF THE INVENTION

The shortcomings of the prior art are overcome and additional advantages are provided by the present invention, including solar cell structures and formation methods which utilize the surface texture in conjunction with the passivating dielectric layer to provide a practical and controllable technique to form an electrical contact between a conducting layer and substrate through the passivating dielectric layer, thus achieving both good surface passivation and electrical contact with low recombination losses, as required for high efficiency solar cells. One method of formation, and resulting structures, are illustrated in, e.g., FIGS. 2-3.

Also disclosed is a technique to produce a controlled-thin-dielectric layer, which allows passage of majority carriers, but blocks the migration of substrate minority carriers to the conducting layer, thereby minimizing carrier recombination losses. This is illustrated in, e.g., FIGS. 6 and 11.

Also disclosed is a practical and controllable technique to create a high efficiency solar cell by injecting dopants through small openings in a passivating dielectric layer into a semiconductor substrate to produce a P-N junction buried beneath a passivating dielectric interface. This results in a junction formed within the substrate (e.g., bulk silicon), below a passivating layer with a low interface state density, thus resulting in low carrier recombination. This is illustrated in, e.g., FIGS. 9-11.

Furthermore, by injecting dopants through a controlled contact area, a gradient dopant concentration can be formed within the contact opening. This dopant gradient is effective at repelling one polarity of carriers, thus resulting in a shielded low-carrier recombination contact. This is illustrated in, e.g., FIGS. 10-11.

Using textured substrate surface features in conjunction with a dielectric passivation layer is a practical technique to control the total area of direct-contact, or alternatively, the thickness of the tunnel dielectric barrier contact between the conductive layer and the substrate. Moreover, a gradient dopant profile is formed through the controlled contact areas in either case. All of these functions are useful in the fabrication of high efficiency solar cells. The principles for the control of the contact area are illustrated in, e.g., FIGS. 4, 7 and 8.

In summary, the present invention includes, in one aspect, a shielded electrical contact through a passivating dielectric layer in a high-efficiency crystalline solar cell, in which the passivating dielectric layer is substantially continuous over a substrate except at controlled contact openings on geometrical texture structures of the substrate. For example, the invention includes controllably providing the controlled contact openings within the dielectric layer by selectively eroding the dielectric layer.

In one aspect, a P-N junction is formed in a substrate beneath the passivating dielectric layer; by, e.g., diffusion or injection of dopants from a dopant-containing conductive layer through the controlled contact openings in the passivating dielectric layer.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in connection with the accompanying drawings in which:

FIGS. 6*a-c* depict exemplary contact structures formed including direct contact or tunnel barrier contact, in accordance with one or more aspects of the present invention;

FIGS. 9*a-b* depict forming a P-N junction beneath a passivating dielectric layer, in accordance with one or more aspects of the present invention;

FIGS. 11*a-d* depict a shielded tunnel barrier contact structure realized in accordance with one or more aspects of the present invention.

DESCRIPTION OF THE INVENTION

Figure 1:
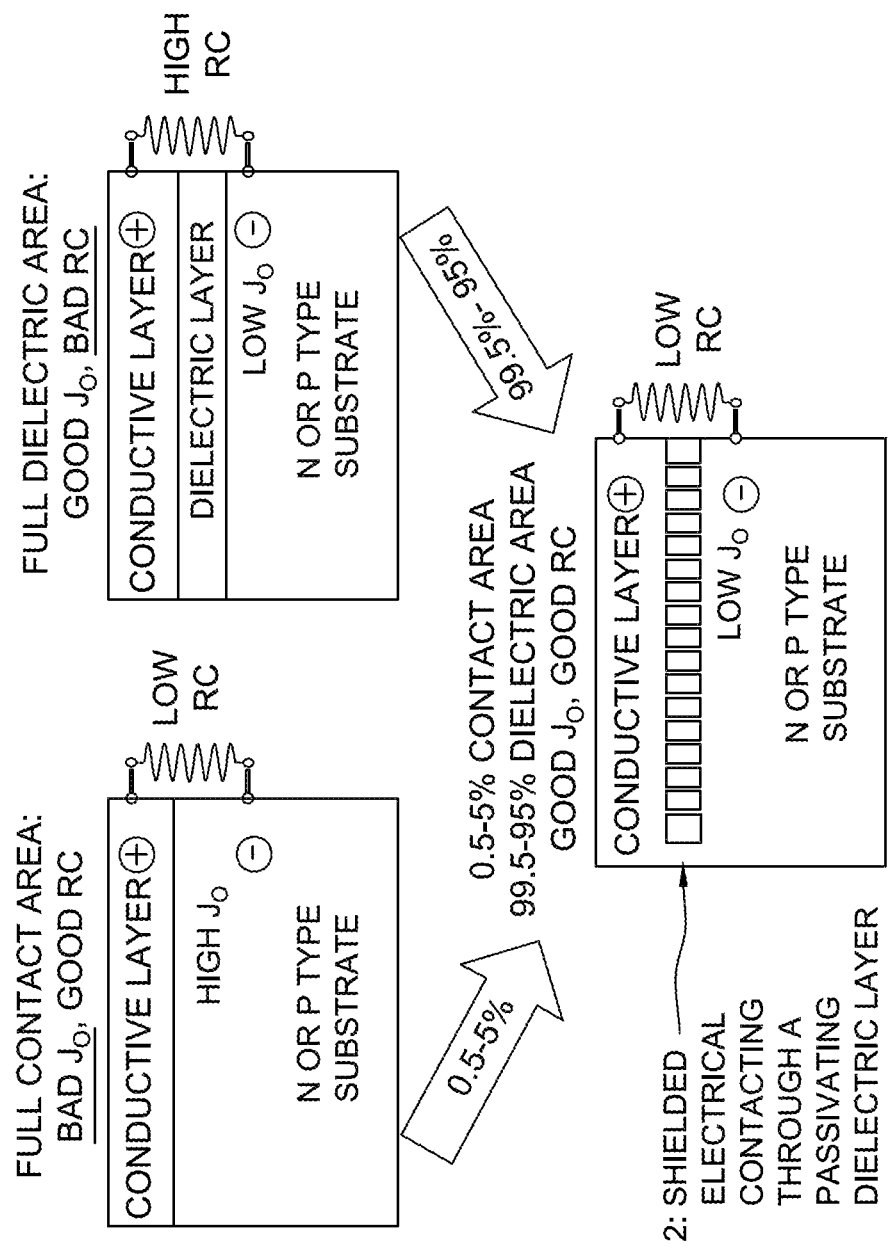
FIG. 1 depicts in schematic form certain requirements of a high efficiency solar cell.

As shown schematically in FIG. 1, high efficiency solar cells require both low recombination current (Jo) and low contact resistance (Rc) between the substrate and conductive layers. A structured interface layer with e.g., 99.5-95% dielectric area and 0.5-5% contact area achieves this requirement.

Figure 2A:
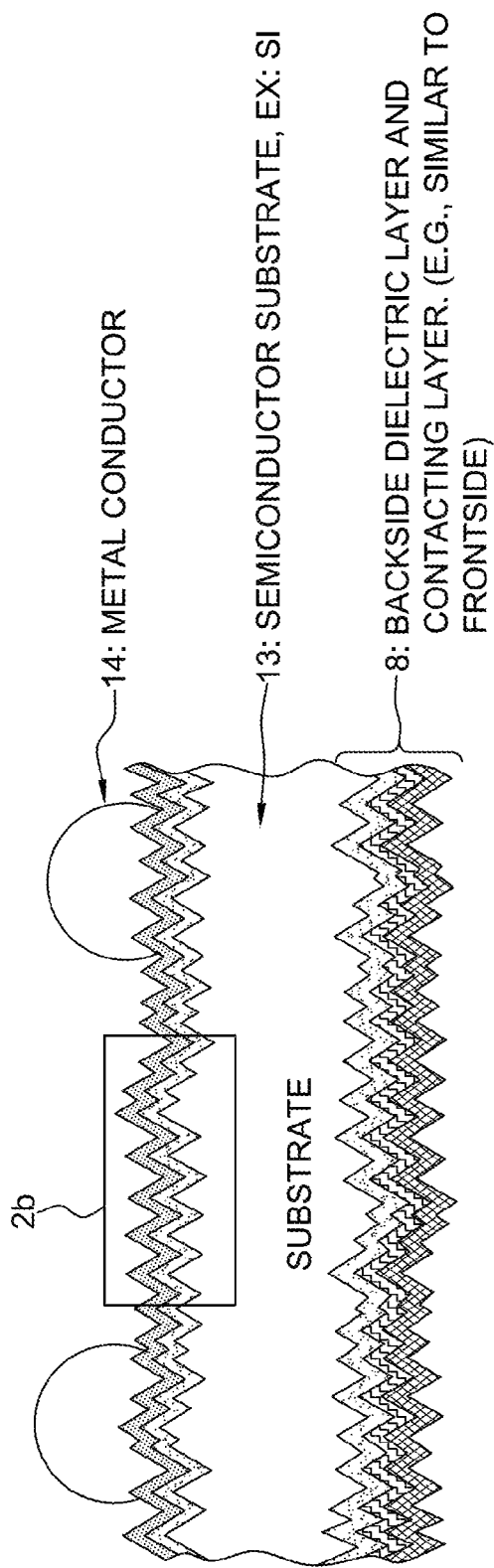
FIGS. 2*a-b* are partial cross-sectional views of an exemplary solar cell with a controlled contact structure, in accordance with one or more aspects of the present invention.
Figure 2B:
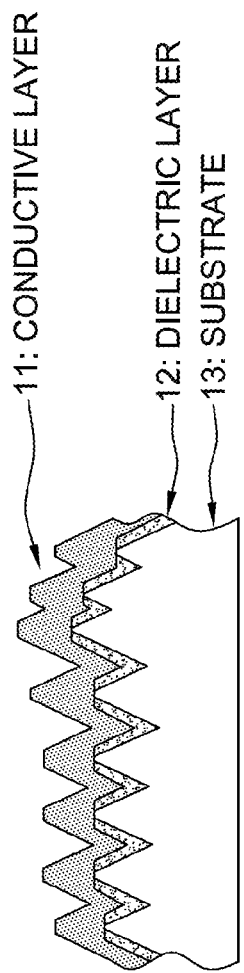

FIGS. 2*a-b* are partial cross-sectional views of an exemplary solar cell with a controlled contact structure, in accordance with one or more aspects of the present invention, in which a high efficiency solar cell 10 provides both well passivated surfaces combined with low contact resistance between the conductive layer 11, metallization 14, and the substrate 13. A structure which utilizes a dielectric layer 12 to passivate the surface while providing for a relatively small area of contact between the conductive layer and the substrate is an ideal structure for high efficiency.

The shielded contact structure described herein is equally suited for use as a front surface structure, as well as a back surface structure 8, or both as simultaneous structures in a high efficiency solar cell.

FIGS. 3*a-e* depict an exemplary process flow and resultant structures for shielded electrical contacting through a passivating dielectric layer, in accordance with one or more aspects of the present invention.

The process steps are discussed in further detail below, and may include (but are not limited to):

Step 21: Providing a substrate. The term "substrate" is used broadly herein to connote any underlying layer or layers to which a conductive connection is required. Therefore, the cell structures herein could include additional, underlying functional layers.

Step 22: Texturizing the substrate-texture (e.g., pyramid peaks) is etched into the substrate to form the base-structure for forming controlled contact areas between the substrate and subsequently deposited conductive layer.

Step 23: Depositing, growing, or otherwise forming a dielectric layer over the texturized substrate—to passivate the substrate and allow for controlled contact between the substrate and the subsequently deposited conductive layer.

Step 24: Opening contacts through portions of the dielectric layer. Contact openings are, e.g., eroded or etched along intersecting planes of the pyramid structure and/or through the peaks of the dielectric layer to form controlled contact openings between the substrate and the subsequently deposited conductive layer.

Step 25: A conductive layer is deposited on the upper surface and over the controlled-contact-openings, forming a controlled-contact structure between the substrate and conductive layer.

Step 26: Diffusing dopants into the substrate if desired (discussed further below).

Figure 3A:
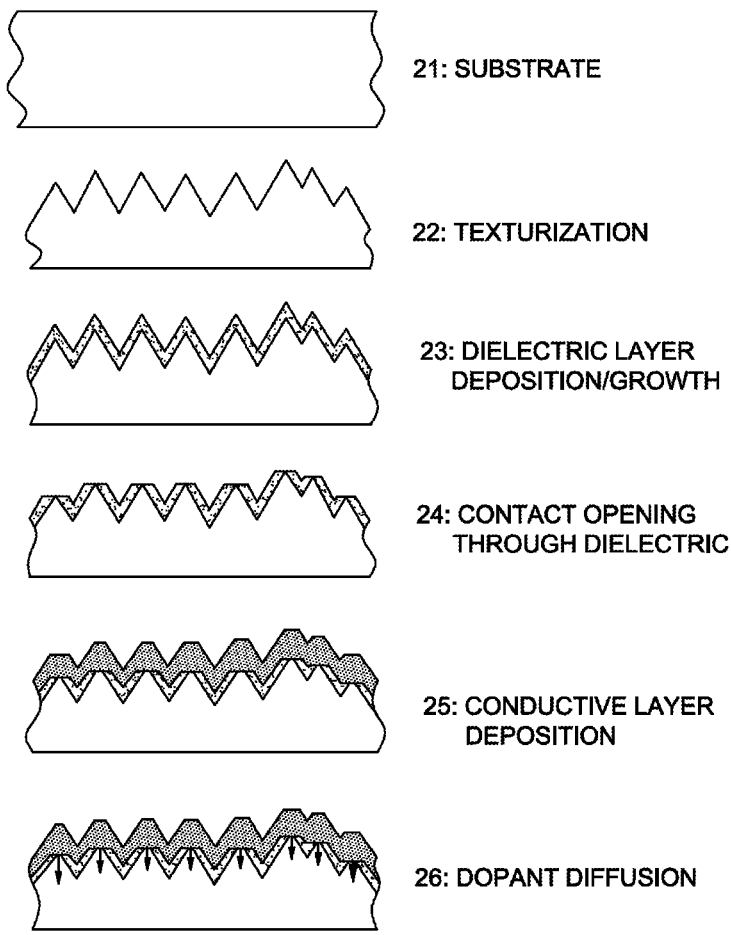
FIGS. 3*a-e* depict an exemplary process flow and resultant structures for shielded electrical contacting through a passivating dielectric layer, in accordance with one or more aspects of the present invention.
Figure 3B:
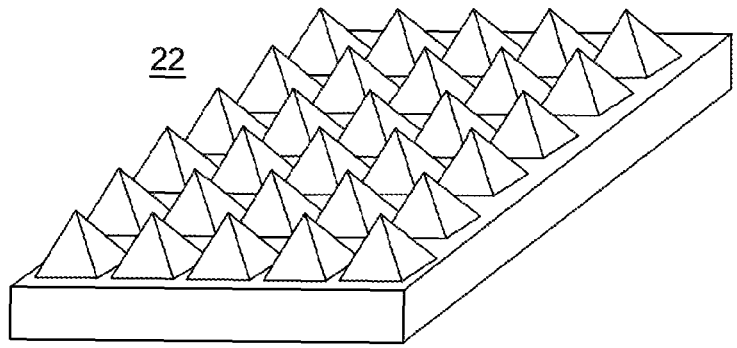
Figure 3C:
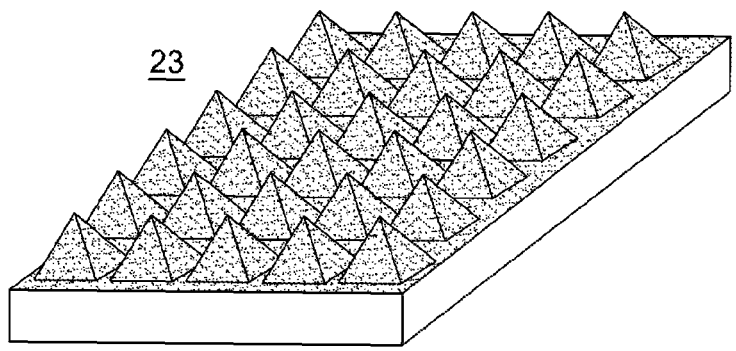
Figure 3D:
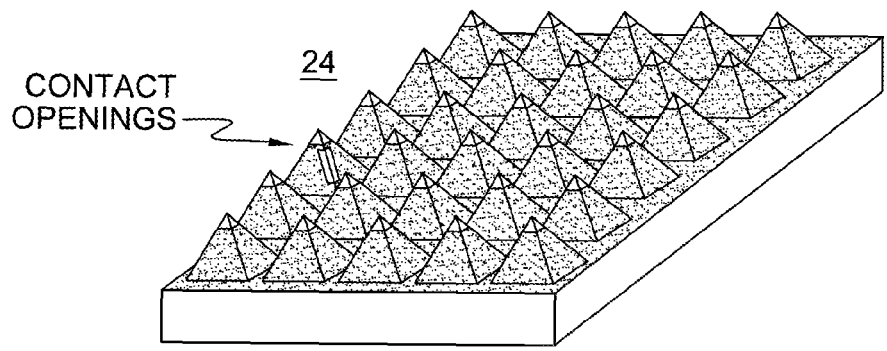
Figure 3E:
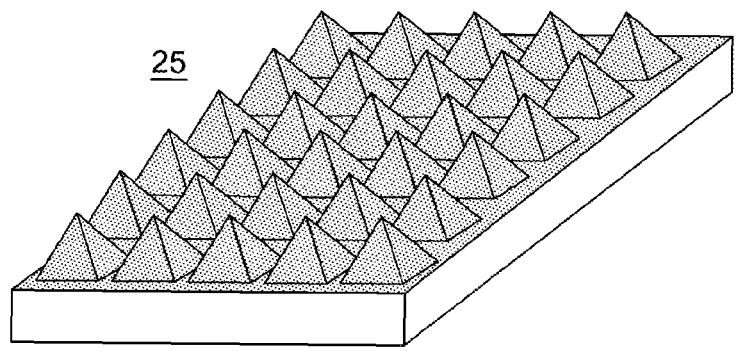

FIGS. 3b-e show perspective views of the texturized structures resulting from steps 22-25 above, respectively, in the case of pyramid texture shapes. FIG. 3d shows exemplary openings at the peaks and/or along intersecting-planes of the pyramids.

Figure 4A:
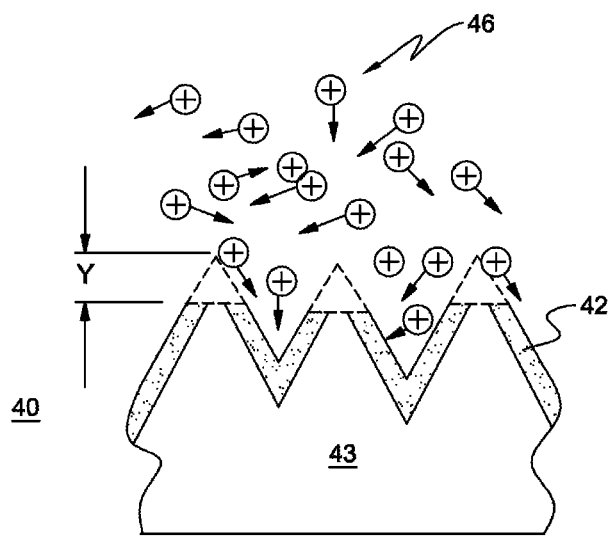
FIGS. 4*a-b* are partial cross-sectional views showing a controlled contact opening through a dielectric layer realized by adjusting etch parameters to achieve desired contact opening area and profile, in accordance with one or more aspects of the present invention.
Figure 4B:
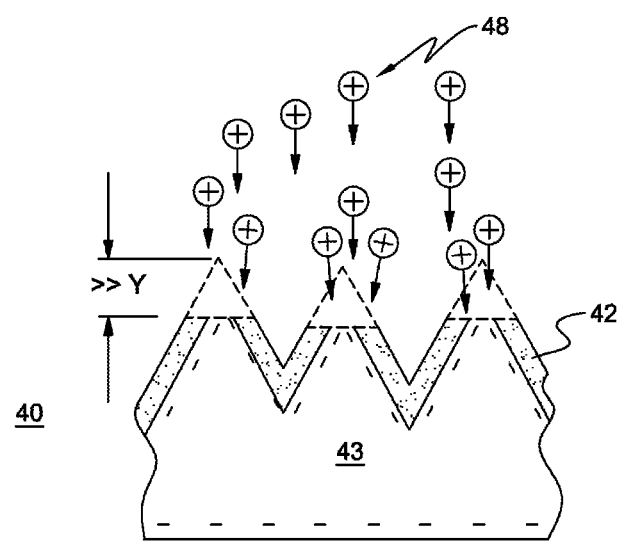

FIGS. 4a-b are partial cross-sectional views showing a controlled contact opening through a dielectric layer 42 over a substrate 43, realized by adjusting etch parameters to achieve desired contact opening area and profile, in accordance with one or more aspects of the present invention. Erosion of the intersecting-planes and/or peak areas of the texture surface can be achieved by increasing the directionality of the ion bombardment 46 through several techniques, including:

1. Increasing the strength of the attracting electrical field at the intersecting planes and peaks of the pyramids by introducing a charge in the substrate through introduction of a DC or RF bias 48 at the substrate (e.g., FIG. 4b).

2. Using a less-reactive gas species in the plasma, increasing erosion due to direct ion bombardment over chemical etching.

3. Reducing the gas pressure, thereby increasing the ion mean free path.

Figure 5:
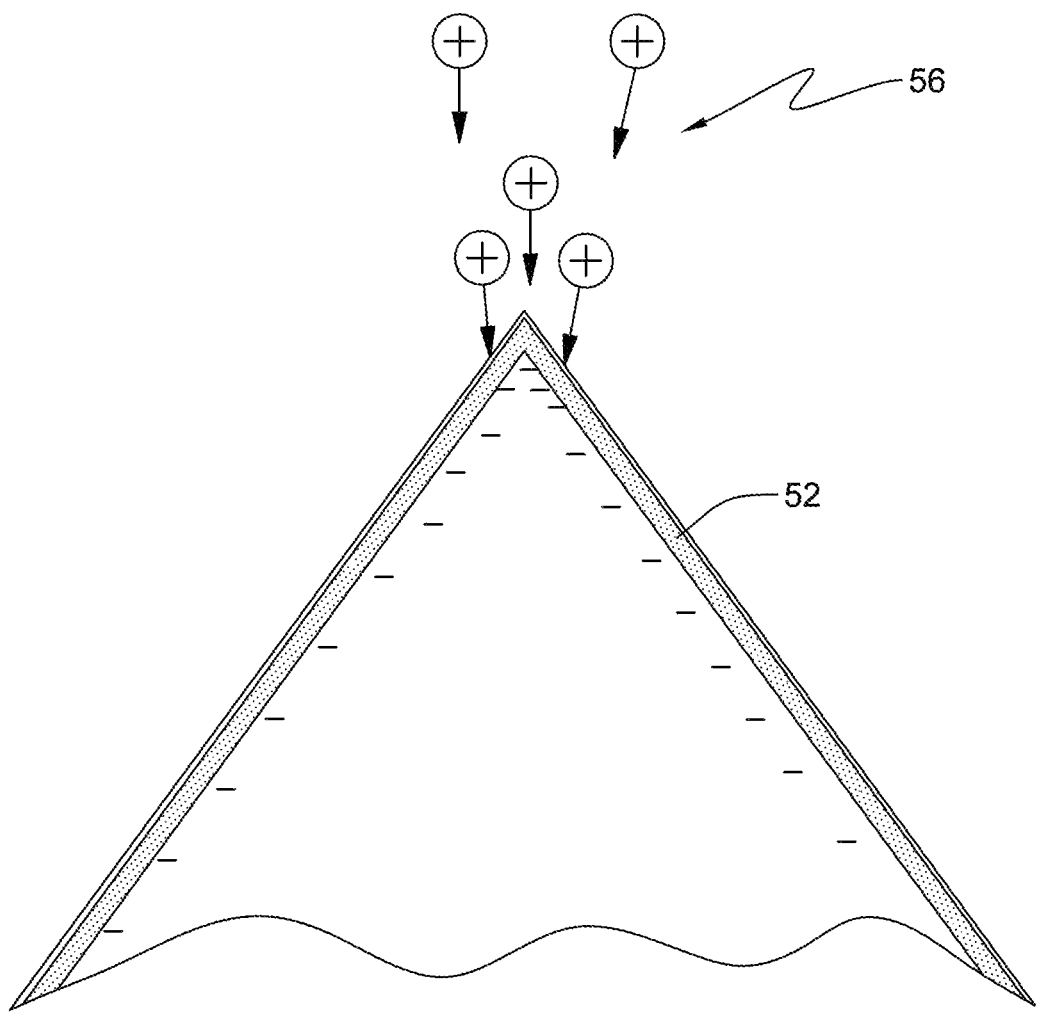
FIG. 5 depicts preferential erosion of the dielectric layer at the peaks, in accordance with one or more aspects of the present invention.

FIG. 5 depicts preferential erosion of the dielectric layer 52 at the peaks, in accordance with one or more aspects of the present invention. Charge density 56 is highest at the intersection of geometrical planes and peaks because on the lateral walls of the pyramid (or other geometrical structure), the repulsive forces of the like-negative charges lie in the plane of the surface, but near sharp intersections of two or more planes or especially at more than three planes forming a peak, the net negative force will be stronger and perpendicular to the surface. As a result, the positive ions emitting from the plasma bombard preferentially on the pyramid plane intersections or peaks due to the stronger attraction between the positive ions and the stronger negative charge at the intersections and peaks.

The passivating dielectric layer erodes preferentially at the peak, due to several factors, including electrical field strength at the peak, stress cracking at the peak, ion bombardment directionality, greater geometrical exposure of the peak, etc.

FIGS. 6a-c depict exemplary contact structures formed including direct contact 65 or tunnel barrier contact 66, in accordance with one or more aspects of the present invention.

In FIG. 6b, the passivating dielectric layer 62 can be eroded all the way through to make a direct contact opening. Alternatively, in FIG. 6c, the passivating dielectric layer 62 can be preferentially thinned at the peak to form a tunneling dielectric barrier contact 66.

Figure 7A:
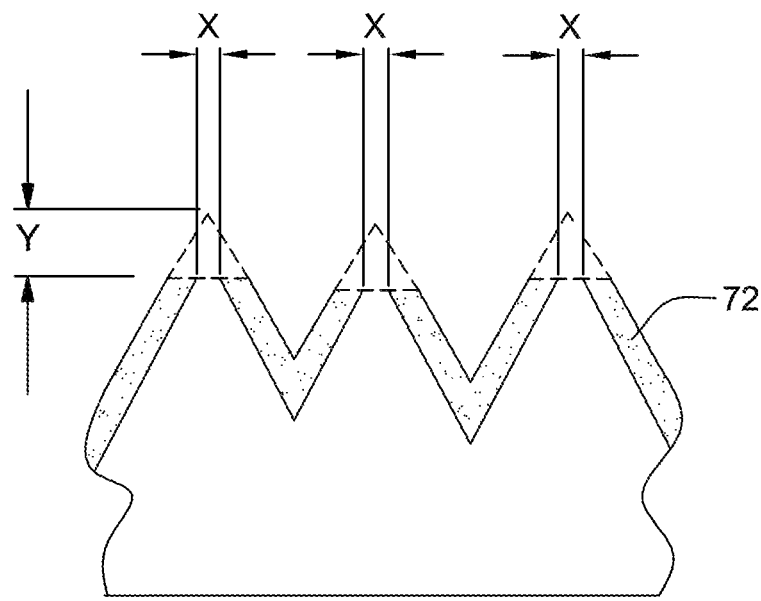
FIGS. 7*a-b* depict contact area control, in accordance with one or more aspects of the present invention.
Figure 7B:
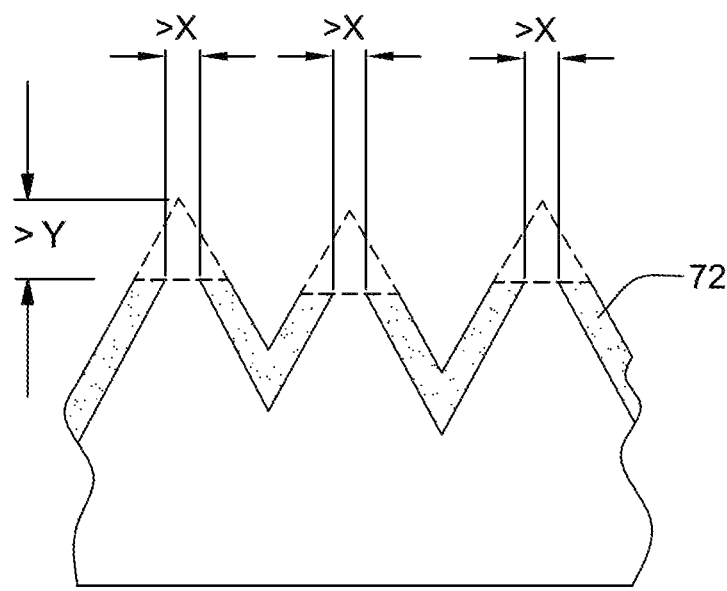

FIGS. 7a-b depict contact area control, in accordance with one or more aspects of the present invention. As the peaks are eroded vertically (Y), the 2-dimensional open contact area through passivating dielectric layer 72 increases (X). Alternatively, the passivating dielectric layer can be preferentially thinned at the peak to form a tunneling dielectric barrier contact, with control of "effective" contact area.

Figure 8A:
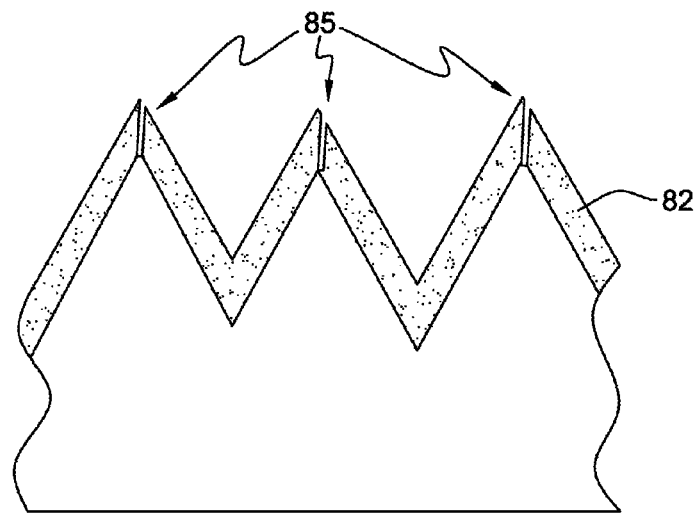
FIGS. 8*a-b* depict an alternative contact opening method using induced cracking of the dielectric layer at the interface planes and peaks to achieve a preferential etch path for the contact opening, in accordance with one or more aspects of the present invention.
Figure 8B:
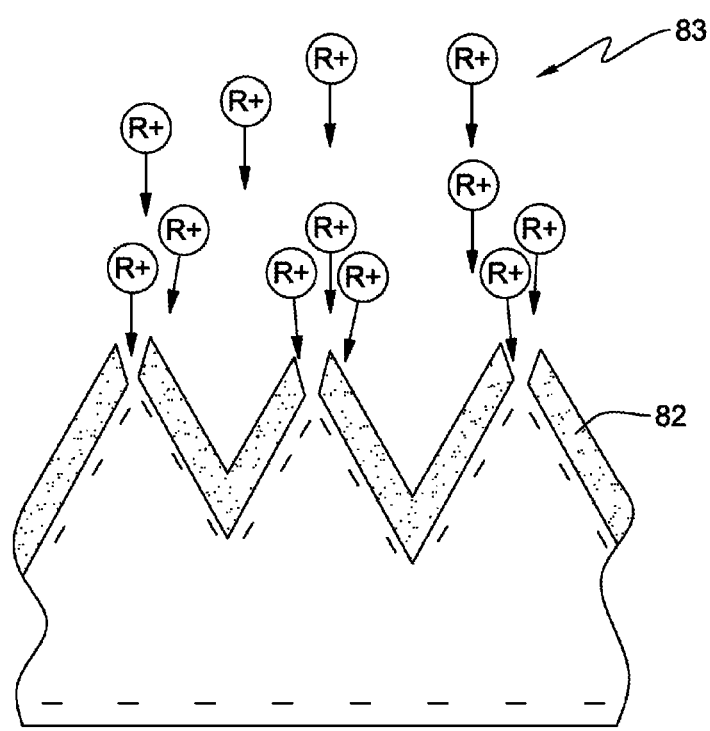
Figure 10B:
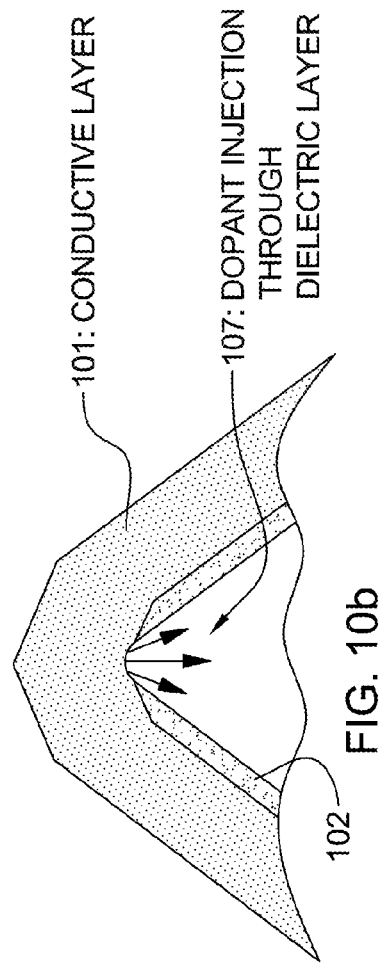
FIGS. 10*a-d* depict a shielded direct-contact structure realized in accordance with one or more aspects of the present invention.
Figure 10D:
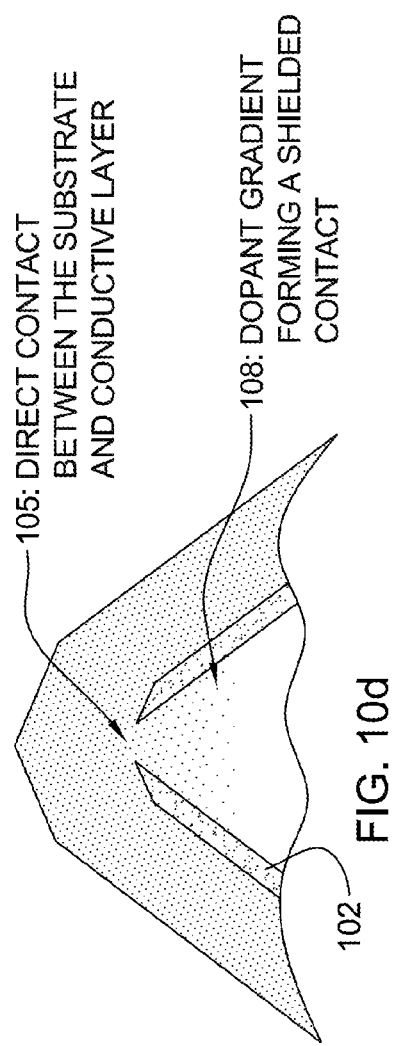
Figure 10A:
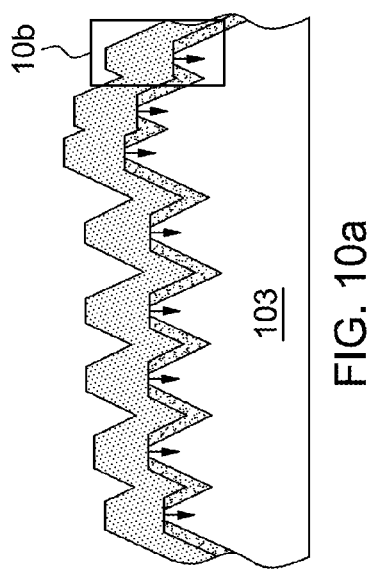
Figure 10C:
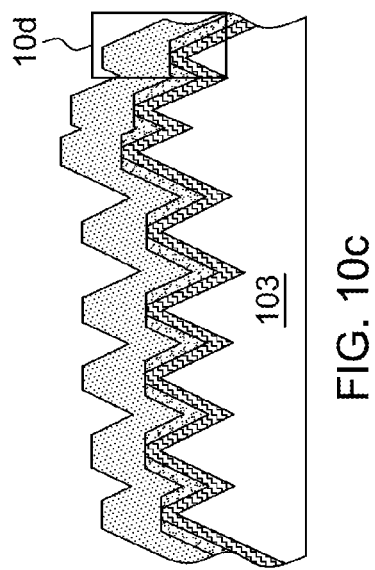

FIGS. 8a-b depict an alternative contact opening method using induced cracking of the dielectric layer 82 at the interface planes and peaks to achieve a preferential etch path for the contact opening, in accordance with one or more aspects of the present invention.

Stress cracks 85 in the dielectric layer can be introduced to preferentially etch along the crack interfaces in a reactive ion etch process. Stress cracks can be thermally induced or caused by other stress at the intersection of interface planes or peaks. Stress at intersecting planes is intrinsically higher than on the plane surfaces and can be further increased through parameters of the dielectric deposition process. Varying the concentration of reactive species and directionality of the ion bombardment 83 can adjust the contact opening profile and area.

FIGS. 9a-b depict forming a P-N junction 98 beneath a passivating dielectric layer, in accordance with one or more aspects of the present invention. A P-N junction 98 formed beneath a passivating dielectric layer by injecting solid-phase dopants 97 into the substrate from a dopant-containing conductive layer 91 through the contact openings in the dielectric layer. Under thermal diffusion, dopant atoms preferentially diffuse through the locations of thinned or eroded dielectric.

FIGS. 10a-d depict a shielded direct-contact structure realized in accordance with one or more aspects of the present invention. A shielded contact (one with low carrier recombination losses) can be formed by formation of a dopant concentration gradient 108 that transitions from high concentration at the conductive layer 101 interface, to a low concentration at the P-N junction within the substrate 103 below the contact area 105 formed by openings in dielectric layer 102. The dopant profile shields the contact from excessive carrier recombination losses. As previously described, the shielded contact can be present at the intersection of two or more planes, preferably at the intersection of three or more, such as the peak of a pyramidal structure, as shown.

FIGS. 11a-d depict a shielded tunnel barrier contact structure realized in accordance with one or more aspects of the present invention. A shielded contact can also be formed by not opening the dielectric layer 112, but by thinning the dielectric to a desired thickness (can be between 5-50 Angstroms), which allows one carrier polarity to tunnel through while presenting a barrier to the passage of the carriers of the opposite polarity. This structure is referred to as a tunnel barrier contact 116. Optionally, a dopant gradient 118 can be formed by diffusing dopants 117 through the tunnel dielectric structure from conductive layer 111 to further shield the contact from recombination losses.

Details of exemplary methods for producing the aforementioned shielded contact structures are described in further detail below. Solar cell substrate surface texture commonly takes the form of a multitude of either regularly or randomly distributed micron-scale pyramidal structures. Other texture morphologies, including conical spiked points or other sharply-raised crystalline substrate structures will work equally well. Surface texturization can be formed using any number of well-known processes including alkaline etch, which produce a pyramidal surface which reflects the underlying substrate crystalline structure, acid etch, which produces an irregular, random conical spiked surface structure. In each case, the texture structures may be first coated with a thin (not necessarily uniform) insulating dielectric layer. The conformal dielectric layer may be deposited through many techniques including thermal oxidation, chemical vapor deposition, physical vapor deposition, etc. By preferentially eroding or etching the conformal dielectric layer either to a desired thickness or entirely off of the peaks or tips of the surface texture, the underlying substrate is either electrically or physically exposed through the conformal dielectric layer, providing paths or openings which form the contacts between the cell substrate and a conductive layer that is subsequently deposited on top of the dielectric layer. Eroding or etching of the dielectric layer, prior to the deposition of the conductive layer, can be performed using several available semiconductor processing techniques, including plasma Reactive Ion Etch (RIE) process or in-situ, through ion bombardment from a plasma enhanced chemical vapor deposition process (PECVD), used to deposit the conductive layer onto the dielectric layer. Other directed energy sources, such as a laser, could be employed to achieve selective erosion of peak areas of the surface texture structures, though in-situ processes previously described are preferred. Several exemplary techniques to preferentially erode or etch the pyramid peaks are described below and in, e.g., FIGS. 3-9.

Control of the contact area through the dielectric may be achieved through a combination of the pyramid geometry, treatment of the dielectric layer, and the intensity and directionality of the ablating energy, as follows:

1. The peaks of the pyramidal or conical-spike texture will erode or etch preferentially relative to the walls and base areas due to several effects. The peaks are more broadly and directly exposed to the etching or eroding energy from a plasma or ion beam.

2. The pyramid shaped texture becomes progressively more truncated as an increasing amount of material is etched from the peak. This is because of the increasing cross-sectional area of the base compared to the peak of the pyramid. In doing so, the contact opening through the dielectric layer and into the substrate progressively increases. This progressively increasing contact area allows one to control the amount of total contact area that has been opened between the conductive layer and the substrate to a desired amount. Increasing the duration and/or intensity of the etch/ion bombardment may be used to control the contact opening area.

3. Inducing a net charge into the substrate, charges will migrate away from like charges, thus repelling the charge to the extremities of the substrate surface, hence the charge density will tend to be highest at intersections of several surface planes, such as is the case of a peak of a pyramid shape or tip of a conical-spike structure. The elevated charge density at such peaks creates a stronger electrical field at the peaks, which attracts a higher flux of ion bombardment than the surrounding areas of lower charge density. Hence, the higher flux of ion bombardment results in a higher etch rate of the dielectric layer at the peaks of such structures. The charging effect can be enhanced further through the use of a DC or RF bias into the substrate. Specifically, this can be achieved in parallel plate plasma reactors in which a voltage bias, either as DC or RF, is applied to the plate which is in contact with the substrate.

4. Thermally induce stress cracks into the dielectric film prior to subjecting the substrate to a plasma, thereby preferentially etching along the stress crack interfaces through the dielectric layer. Surface texture structures have larger cross-sectional area at the base and come to a point area at the peaks. This characteristic geometrical shape is used to provide a method to control the contact area relative to overall passivated surface area.

5. Controlling the plasma etch conditions which affect the ion bombardment energy, direction, reactivity and time. These parameters are readily controlled in modern plasma reactors such as PECVD, or Plasma Etch chambers. FIGS. 4-6 illustrate (by way of example) the concepts described to control the ion bombardment directionality. Alternatively, other methods that utilize an energetic beam source, such as electron beam, ion-beam, laser etc., could be applied. FIGS. 3*a-e* illustrate the concept of using the texture structure and a technique of making a multitude of contacts of a controlled cross-sectional area, between a conductive layer which is deposited continuously over the dielectric.

In all of the aforementioned structures, shielded electrical contact may be made to the substrate 1) as a controlled-area direct contact between the conductive layer and the substrate, and/or 2) via majority carrier transport through a controlled-thin-dielectric tunneling barrier. These two basic contact structures are illustrated in FIGS. 6, 10 and 11.

In the case of the direct contact, the completed cross-sectional structure is comprised of a stacked layer starting from a textured crystalline solar cell substrate with a multitude of electrically conductive contacts passing through a passivating dielectric layer to an upper electrically conductive layer. Because the texture on a solar cell substrate is comprised of millions of uniformly distributed pyramids or conical spikes across the entire surface of a solar cell substrate, this structure and method provides a technique of forming well-distributed contacts of a controlled cross-sectional area between the substrate and conductive layer in a solar cell.

The structures that have been described herein minimize carrier recombination in areas underneath the contacts through several techniques. One technique is minimizing the total contact area between the conductive layer and the substrate relative to the total cell area, ideally to 0.5% up to 5%. Another technique is shielding the contacts by leaving a controlled-thin-dielectric passivation layer in place, relying on tunneling current through the dielectric. A third technique is injecting a high concentration of dopants through the relatively small contact areas, resulting in a high doping atom concentration at the contact, which reduces recombination losses by reducing the number of carriers of the opposite charge in the vicinity of the contact.

In one embodiment, a solar cell substrate is first etched to form a pyramidal surface texture. Next, the substrate is continuously coated with a dielectric passivation layer. Next, in-situ with and prior to the deposition of a conductive layer, the dielectric layer is eroded from the peaks of the pyramidal texture micro-structure. Next, the dielectric layer is coated with a dopant-containing conductive layer. Next, using thermally activated diffusion, the dopants contained in the conductive layer are injected through the field of controlled contact openings formed in the dielectric layer at the eroded peaks of a pyramidal or spike-shaped textured surface profile. The dopants injected through the contact openings diffuse into a continuous P-N junction within the substrate beneath the passivating dielectric layer. Low recombination losses is achieved by virtue of the very low total contact area relative to the total passivating area (less than 5/100) combined with a gradient of dopant concentration within the contacts, which creates a charge polarity which repels one polarity of carriers thereby reducing carrier recombination losses. The above-described embodiment of this invention is highly beneficial in the fabrication of high efficiency solar cells. One embodiment of this is illustrated in FIGS. 9-11.

The shielded contact structure described herein is equally suited for use as a front surface field as well as a back surface field, or both as simultaneous structures of a high efficiency solar cell.

Figure 12:
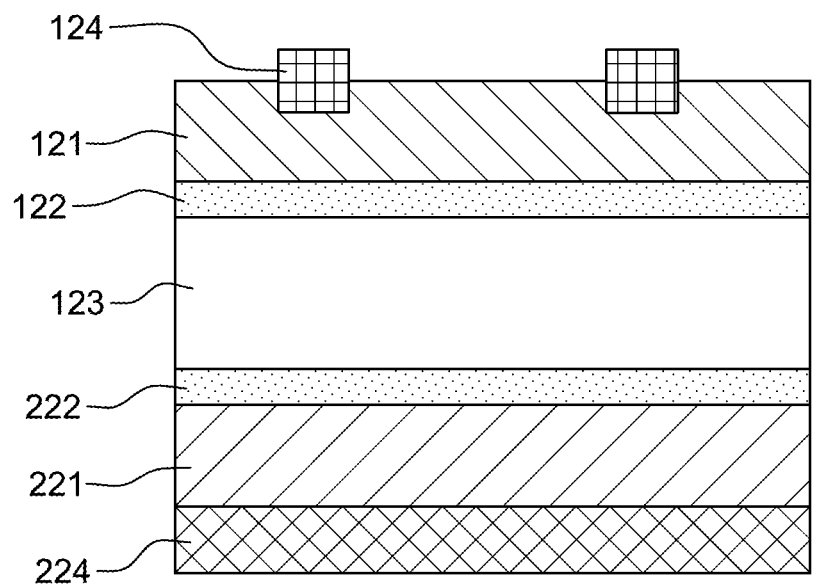
FIG. 12 is a partial cross-sectional view of an exemplary solar cell having multifunctional layers requiring electrical contact, in accordance with one or more aspects of the present invention.

In accordance with the above incorporated Applications entitled "High-Efficiency Solar Cell Structures and Methods of Manufacture", a cell comprising an n-type front, n-type wafer, p-type back, multifunctional transparent, conductive, highly doped silicon compound (or one of opposite polarity) can be used in combination with any of the contact features of present invention. One embodiment of this is shown in FIG. 12, including the following exemplary layers:

124: Front metal contact

121: Transparent and conductive film:

Examples

Amorphous or Polycrystalline Silicon Carbides n-type silicon carbide: phophorus doped silicon carbide, nitrogen doped silicon carbide, Amorphous or Polycrystalline Silicon:

n-type amorphous silicon: phosphorus doped amorphous silicon, nitrogen doped amorphous silicon,

122: Electrically passivating interface layer;

Examples silicon oxide, silicon nitride, amorphous silicon, silicon carbide, aluminum oxide, aluminum nitride;

123: n-type crystalline silicon wafer thickness is the range of w<300 um, base resistivity for n-type wafers 0.5 Ohm cm<rho<10 Ohm cm, for p-type wafers 0.1 Ohm cm<rho<100 Ohm cm

222: Electrically passivating interface layer;

Examples silicon oxide, silicon nitride, amorphous silicon, intrinsic silicon carbide, aluminum oxide, aluminum nitride;

221: transparent and conductive film

Examples amorphous or polycrystalline silicon carbides:

p-type silicon carbide: boron doped silicon carbide, aluminum doped silicon carbide, gallium doped silicon carbide, . . . .

amorphous or polycrystalline silicon:

p-type amorphous silicon: boron doped amorphous silicon, aluminum doped amorphous silicon, gallium doped silicon carbide, . . . .

224: back metal

The layers described within the above solar cell structures can be deposited or grown with standard methods like PECVD, APCVD, LPCVD, PVD, plating etc. For some layers and combinations of layers, innovative methods of producing the layers and structures are necessary.

In order to achieve a highly efficient solar cell with a cost-effective production method, it is advantageous to deposit films of different characteristics only on one side. While this is very hard to do, next to impossible, for a standard tube furnace deposition of e.g. LPCVD deposited polycrystalline silicon, a PECVD deposition can be done on one side of a wafer without deposition on the other side. PECVD tools are available on industrial scale but they only operate in temperature regimes where amorphous or microcrystalline silicon layers can be deposited. In the described cell structures, amorphous silicon layers can be turned into polycrystalline silicon layers by a thermal treatment. This also holds for doped amorphous silicon layers or compounds of amorphous silicon carbides, etc. This recrystallization negatively affects the passivation quality of the silicon/amorphous silicon interface layer in case it exists in the cell structure. However, having an insulator buffers the wafer surface from the crystallized polysilicon layer. This way the interface is still passivated after the thermal treatment and the layer systems are high-temperature stable. During the crystallization process many properties of the layer change: Donors or acceptors get activated, the optical transmission increases, hydrogen effuses from the layer.

The present invention extends to any type of integrated, semiconductor circuits having layers requiring conductive contact, in addition to the solar cell examples disclosed herein.

In summary, certain aspects of the present invention include but are not limited to:

A shielded electrical contact through a passivating dielectric layer in a high-efficiency crystalline solar cell, structure and methods of manufacture.

A shielded contact through a passivating dielectric that is formed by modifying the geometrical features of surface texture formed on a solar cell substrate.

A shielded contact structure and method forming both a front surface field and/or a back surface field.

A contact structure and method in which the passivating dielectric layer is fully continuous over the substrate with the only exception being at the controlled-contact openings on the geometrical texture structures.

A contact structure and method which can controllably achieve between 0.5-5% total contact area by selectively eroding a dielectric layer coated on the surface texture of a solar cell substrate.

A contact structure and method which can controllably achieve between 0.5-5% total contact area distributed at uniform overall density with a controlled area coverage ratio across the surface area of a solar cell substrate by selectively eroding controlled areas of a dielectric layer coated on the geometrical surface texture of a solar cell substrate.

A contact structure and method which can controllably achieve between 0.5-5% total contact area by selectively eroding controlled areas of a dielectric layer coated on the geometrical surface texture of a solar cell substrate through plasma ion bombardment or reactive ion etching.

A contact structure and method which can controllably achieve between 0.5-5% total contact area by selectively eroding controlled areas of a dielectric layer coated on the geometrical surface texture of a solar cell substrate by directed ablation energy, such as LASER.

A shielded contact through a passivating dielectric that is formed by modifying the geometrical features of surface texture on the solar cell substrate prior to deposition of a conductive layer.

A shielded contact through a passivating dielectric that is formed by modifying the geometrical features of surface texture on the solar cell substrate in-situ with the deposition of a conducive layer.

A contact through a passivating dielectric that is formed by modifying the geometrical features of surface texture on the solar cell substrate by utilizing the geometrical shape of the texture structure to control the contact opening area in a dielectric layer.

A contact through a passivating dielectric in which the geometrical shape of the texture structure is larger at the base and converging to a sharp peak or spiked-tip which allows the contact opening area to be progressively increased as the peak or spiked-tip is progressively eroded off.

A contact through a passivating dielectric in which the geometrical shape of the texture structure is a pyramid shape, conical-spike or other structure monolithically protruding out of a crystalline solar cell substrate of less than 180-degree included angle.

A contact structure that is either a shielded-direct contact between a solar cell substrate and a conductive layer or a thin-dielectric tunnel barrier contact.

A contact and method of manufacturing in which the contact opening area through a passivating dielectric is not highly dependent on having a uniform height of the geometrical texture structures, including pyramid or conical-spike structures.

A contact structure and method in which a P-N junction is formed in a substrate beneath a passivated dielectric layer.

A contact structure and method in which a P-N junction is formed in a substrate beneath a passivated dielectric layer via diffusion or injection of dopants from a dopant-containing conductive layer through controlled openings in a passivating dielectric layer.

A contact structure and method that is either a shielded-direct contact between a solar cell substrate and a conductive layer or a thin-dielectric tunnel barrier contact that is further shielded by injection or diffusion of dopants from the conductive layer through the contact opening or through the tunnel barrier into the substrate below the contact.

A contact structure and method that is further shielded by injection or diffusion of dopants from the conductive layer through the contact opening or through the tunnel barrier into the substrate below the contact forming a dopant concentration gradient within the contact.

A contact through a passivating dielectric that is formed by preferentially eroding the dielectric layer at the peaks of the geometrical features of surface texture due to greater physical exposure to the eroding energy, such as ion bombardment.

A contact through a passivating dielectric that is formed by modifying the geometrical features of surface texture on the solar cell substrate by utilizing an electric charge or electrical field that is concentrated due to the geometrical shape of the texture structure to preferentially erode the dielectric layer over specific areas of the texture structures.

A structure and method in which the dopant diffusion depth is greatest at peaks and intersecting planes, in comparison to flat surfaces and valleys, thereby forming the P-N junction furthest away from said peaks and intersecting planes, hence contributing to a device with minimized surface recombination.

A contact through a passivating dielectric that is formed by preferentially eroding the dielectric layer along the intersections of two or more geometrical planes of the surface texture structure on the solar cell substrate by utilizing an electric charge or electrical field that is concentrated due to the geometrical shape and electrical charging capacity of the structure.

A contact through a passivating dielectric that is formed by preferentially eroding the dielectric layer at the peak formed at the intersections of three or more geometrical planes of surface texture on the solar cell substrate by utilizing an electric charge or electrical field that is concentrated due to the geometrical shape of the texture structure to preferentially erode the dielectric layer over specific areas of the texture structures.

Stress cracks in the dielectric layer introduced to enhance preferential etching along the crack interfaces in a reactive ion etch process.

Stress cracks located at the intersection of two or more interface planes or peaks due intrinsically higher stress at the intersection of planes and further increased through parameters of the dielectric deposition process used to enhance preferential etching of the surface texture structures.

The process flows depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method comprising:
providing a textured substrate the textured substrate comprising geometrical texture structures having shapes comprising upper peaks;
providing a passivating dielectric layer over the textured substrate; and
preferentially etching the passivating layer over the upper peaks of the geometrical texture structures to form controlled contact openings through the passivating dielectric layer to the upper peaks, the preferentially etching comprising introducing, during the preferential etching, an electrical bias into the substrate, the electrical bias producing an increased electric field strength at the upper peaks, the increased electric field strength facilitating the preferential etching of the passivating dielectric layer from over the user peaks of the geometrical texture structures.

2. The method of claim 1, wherein the preferentially etching the passivating dielectric layer further comprises plasma ion bombardment or reactive ion etching, and wherein the increased electric field strength at the upper peaks of the geometrical texture structures directs ions toward the upper peaks to facilitate preferential etching of the passivating dielectric layer from over the upper peaks of the geometrical texture structures.

3. The method of claim 1 wherein the preferentially etching the passivating dielectric layer further comprises etching, by directed ablation energy, the passivating dielectric layer, and wherein the increased electric field strength at the upper peaks of the geometrical texture structures facilitates directing the ablation energy toward the upper peaks to facilitate preferential etching of the passivating dielectric layer from over the upper peaks of the geometrical texture structures.

4. The method of claim 1, wherein the shapes of the geometrical texture structures are larger at bases thereof, and converging at the upper peaks, the shapes of the geometrical texture structures naturally increasing a size of the controlled contact openings as the passivating dielectric layer is progressively removed.

5. The method of claim 1, further comprising forming a P-N junction in the substrate beneath the passivating dielectric layer.

6. The method of claim 5, in which the P-N junction is formed via diffusion or injection of a dopant from a dopant-containing conductive layer through the controlled contact openings in the passivating dielectric layer.

7. The method of claim 6, in which the diffusion or injection of dopants forms a dopant concentration gradient in the Geometrical texture structures, wherein the dopant concentration gradient transitions from a high concentration at the upper peaks of the geometrical texture structures to a low concentration at the P-N junction within the substrate below the conductive contact openings, the dopant concentration gradient facilitating minimizing carrier recombination at the conductive contact openings.

8. The method of claim 1, wherein the upper peaks of the geometrical texture structures have included angles of less than 180 degrees.

9. The method of claim 8, wherein introducing an electrical bias into the substrate preferentially increases a charge density in the upper peaks due, at least in part, to the upper peaks having included angles of less than 180 degrees, the increased charge density producing the increased electric field strength at the upper peaks.

* * * * *

UNITED STATES PATENT AND TRADEMARK OFFICE
CERTIFICATE OF CORRECTION

| | | |
|---|---|---|
| PATENT NO. | : 9,184,314 B2 | |
| APPLICATION NO. | : 13/637176 | |
| DATED | : November 10, 2015 | |
| INVENTOR(S) | : Crafts et al. | |

It is certified that error appears in the above-identified patent and that said Letters Patent is hereby corrected as shown below:

Title Page

In the Inventors (75): Delete "Oliver Schultz-Wittman" and insert -- Oliver Schultz-Wittmann --

In the Claims

Column 13, Line 8: Claim 1, Delete "passivating layer" and insert -- passivating dielectric layer --

Column 14, Line 18: Claim 7, Delete "Geometrical" and insert -- geometrical --

Signed and Sealed this
Twenty-ninth Day of March, 2016

Michelle K. Lee
*Director of the United States Patent and Trademark Office*